US007825836B1

United States Patent
Liu et al.

(10) Patent No.: US 7,825,836 B1
(45) Date of Patent: Nov. 2, 2010

(54) LIMIT EQUALIZER OUTPUT BASED TIMING LOOP

(75) Inventors: Jingfeng Liu, Longmont, CO (US); Mats Oberg, Cupertino, CA (US); Zachary Keirn, Loveland, CO (US); Bin Ni, Sunnyvale, CA (US)

(73) Assignee: Marvell International, Ltd, Hamilton (BM)

( * ) Notice: Subject to any disclaimer, the term of this patent is extended or adjusted under 35 U.S.C. 154(b) by 0 days.

(21) Appl. No.: 12/019,430

(22) Filed: Jan. 24, 2008

Related U.S. Application Data

(63) Continuation-in-part of application No. 11/775,757, filed on Jul. 10, 2007, now Pat. No. 7,525,460.

(60) Provisional application No. 60/887,032, filed on Jan. 29, 2007, provisional application No. 60/886,790, filed on Jan. 26, 2007, provisional application No. 60/830,628, filed on Jul. 13, 2006.

(51) Int. Cl.
 *H03M 1/48* (2006.01)
(52) U.S. Cl. .................. 341/111; 341/155; 375/355
(58) Field of Classification Search .............. 341/155, 341/111, 115, 157, 118, 120; 375/350, 317, 375/345, 232, 355
See application file for complete search history.

(56) References Cited

U.S. PATENT DOCUMENTS

| 4,527,145 | A | 7/1985 | Haussmann et al. |
| 5,877,816 | A | 3/1999 | Kim |
| 6,646,822 | B1 | 11/2003 | Tuttle et al. |
| 6,867,941 | B1 | 3/2005 | Ozdemir |
| 6,922,346 | B2 | 7/2005 | Wofford et al. |
| 7,023,941 | B1 | 4/2006 | Rey et al. |
| 7,170,931 | B2 * | 1/2007 | Greiss et al. ............... 375/232 |
| 7,178,093 | B2 | 2/2007 | Chen et al. |
| 7,221,638 | B2 * | 5/2007 | Rapp .................... 369/124.15 |
| 7,440,525 | B2 * | 10/2008 | Moughabghab et al. ..... 375/345 |
| 7,489,740 | B2 * | 2/2009 | Yen et al. ................... 375/317 |
| 2002/0145680 | A1 | 10/2002 | Hong |
| 2003/0206604 | A1 * | 11/2003 | Lai ........................... 375/350 |
| 2004/0076245 | A1 | 4/2004 | Okamoto et al. |
| 2008/0080606 | A1 * | 4/2008 | Wang et al. ................ 375/232 |

OTHER PUBLICATIONS

Effects of Limit Equalizer in Blu-Ray Disc Format, Manuscript received Jul. 21, 2003, Hideki Kobayashi, Hiroki Kuribayashi, Yoshimi Tomita, and Seiichi Ohsawa.
Blu-Ray Disc Association; 1. A Physical Format Specification for BD-RE, $2^{nd}$ Edition, Feb. 2006.
IEEE Transactions on Communications, vol. 50, No. 12, Dec. 2002; Modeling and Compensation of Asymmetry in Optical Recording, Haralampos Pozidis, Member, IEEE, Jan W. M. Bergmans, Senior Member, IEEE, and Wim M. J. Coene.
A Linearly Constrained Adaptive Fir Filter for Hard Disk Drive Read Channels, pp. 1613-1617, 1997; Li Du, Mark Spurbeck, Richard T. Behrens, Cirrus Logic, Colorado, 305 Interlocken Pkwy, Broomfield, CO 80021.

* cited by examiner

*Primary Examiner*—Peguy JeanPierre

(57) ABSTRACT

A timing loop for generating a channel clock signal for driving an analog to digital converter (ADC) includes a slicer bias loop configured to generate an asymmetry compensation signal for a digital output signal from the ADC, the first adder configured to asymmetrically compensate the digital output signal based on the asymmetry compensation signal from the slicer bias loop, a limit equalizer configured to limit a boost range of the asymmetrically compensated digital output signal from the adder, a slicer configured to generate a temporary decision signal based on the asymmetrically compensated digital output signal from the limit equalizer, a phase detector configured to generate a timing error signal based on the asymmetrically compensated digital output signal from the limit equalizer and the temporary decision signal from the slicer; and the first filter configured to generate a clock signal for driving the ADC based on the time error signal from the phase detector.

21 Claims, 15 Drawing Sheets

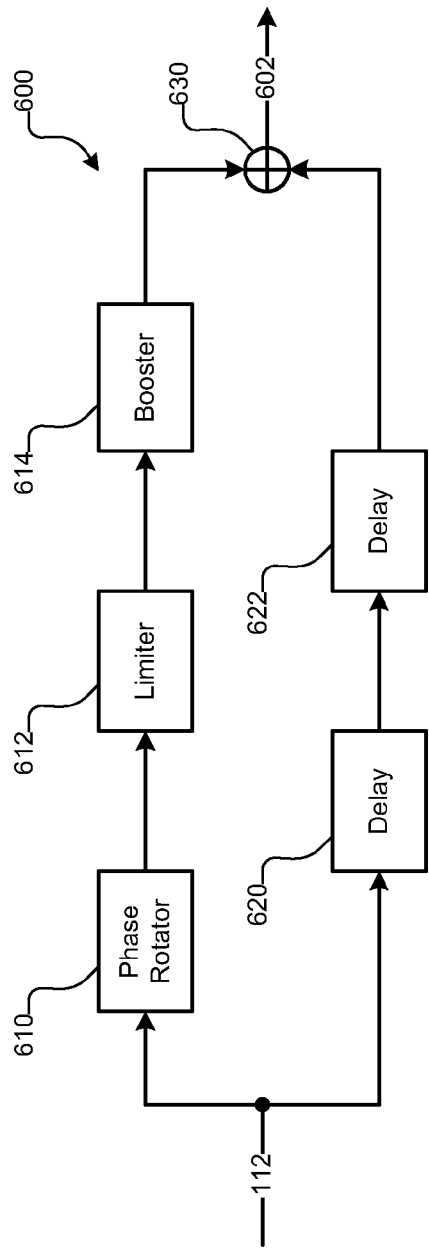
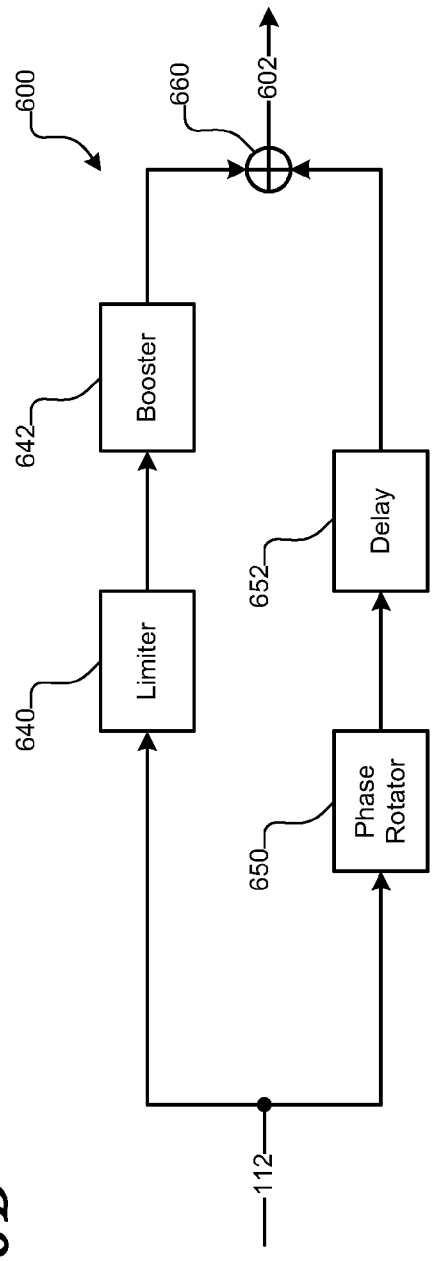

LIMIT EQUALIZER OUTPUT BASED TIMING LOOP

CROSS REFERENCE TO RELATED APPLICATION

This application is a continuation-in-part of U.S. patent application Ser. No. 11/775,757, entitled "TIMING LOOP BASED ON ANALOG TO DIGITAL CONVERTER OUTPUT AND METHOD OF USE," which was filed on Jul. 10, 2007 by the inventors of the present disclosure and issued as U.S. Pat. No. 7,525,460 on Apr. 28, 2009, and incorporated by reference in its entirety and which claims priority under 35 U.S.C. §119(e) to provisional U.S. Patent Application No. 60/830,628, filed on Jul. 13, 2006, the disclosure of which is expressly incorporated by reference herein in its entirety. This application further claims priority under 35 U.S.C. §119(e) from U.S. Provisional Application No. 60/886,790, entitled "LIMIT EQUALIZER OUTPUT BASED TIMING LOOP" filed on Jan. 26, 2007, and U.S. Provisional Application No. 60/887,032, entitled "LIMIT EQUALIZER OUTPUT BASED TIMING LOOP" filed on Jan. 29, 2007, by the inventors of the present disclosure and incorporated by reference in their entirety.

BACKGROUND

1. Field of the Disclosure

The disclosure is directed generally to digital signal processing (DSP), more particularly to a limit equalizer output based timing loop for an analog to digital converter (ADC) and to a method of use of an ADC that provides improved timing and/or timing recovery.

2. Related Art

In order to generate a timing signal and/or timing recovery signal, such as a read channel clock for a read channel of an optical storage device, a conventional phase detector (PD) uses the output of a filter arranged downstream of the ADC output, such as a finite impulse response (FIR) filter, as a basis for the generation of the timing signal. Such an arrangement produces inferior performance because the output of the filter, which is used to provide signal equalization to the output of the ADC, causes the timing signal to be compromised. In particular, the filter causes a phase shift in the timing and/or timing recovery signal. This is based, in part, on the fact that the filter is designed predominantly to be adaptive to the density variation of the optical storage device and to focus offsets or other errors of the device or media that require a change in the equalization and the like. Moreover, the filter is designed with a partial response target to improve the performance of an associated detector circuit such as a Viterbi circuit. Thus, these two design criteria drive the timing signal to have a change in phase as noted above. Accordingly, it is difficult to design a filter, such as a FIR filter, that is well constrained to meet multiple diverse demands.

Additionally, readback signals from an optical storage device, such as a CD, DVD, HD DVD or Blu-Ray disc, also suffers from manufacturing defects common with the stamping process in the manufacture thereof, or writing of recordable media. Such defects include, for example, variations in pit size and the like. These defects may result in high and low amplitudes that are not equal. The defects may also cause the transitions between land and pit to be shifted. In particular, non-linearity defects cause a deterioration of the performance of the timing loop in the optical storage devices.

To address these issues, the related U.S. patent application Ser. No. 11/775,757 discloses a timing loop based on an ADC output, in which the slicer output and asymmetry compensated output are provided as inputs to a phase detector for deriving an error signal for the timing loop. However, in the situation where there is severe inter-symbol interference (ISI), the ADC output may not cross zero for short mark/space transitions, which may cause excess timing jitter when an asymmetry compensated ADC output is used directly to drive the timing loop.

Accordingly, there is a need for an improved timing loop that does not suffer excess timing jitter when ISI occurs.

SUMMARY

The disclosure provides a circuit and method that generate a timing or timing recovery signal responsive to the output of the ADC that does not suffer from the drawbacks and disadvantages noted above, including changes in phase of other device components.

The disclosure may be implemented in a number of ways. According to one aspect of the disclosure, a timing loop for generating a channel clock signal for driving an analog to digital converter (ADC) includes a limit equalizer configured to boost high frequency components of a digital output signal from the ADC, a slicer configured to generate a temporary decision signal based on the boosted digital output signal from the limit equalizer, a phase detector configured to generate a timing error signal based on the boosted digital output signal from the limit equalizer and the temporary decision signal from the slicer, and a first filter configured to generate a clock signal for driving the ADC based on the timing error signal from the phase detector.

The timing loop may further include a first booster configured to boost the digital output signal. The first booster may include a finite impulse response (FIR) filter. The first booster may include first, second and third branches arranged in parallel and an adder connected to the first, second and third branches. The first branch may include a first multiplier configured to multiply the digital output signal from the ADC by a first value. The second branch may include a first delay and a second multiplier arranged in series, and the second multiplier may be configured to multiply an output from the first delay by a second value. The third branch may include the first delay, a second delay and a third multiplier arranged in series, and the third multiplier may be configured to multiply an output from the second delay by a third value. The first booster may be responsive to the ADC, and the limit equalizer may be responsive to the booster.

The digital output signal from the ADC may be an asymmetrically compensated digital output signal. The timing loop may further include a slicer bias loop configured to generate an asymmetry compensation signal for the digital output signal from the ADC, and a first adder configured to asymmetrically compensate a digital output signal from the ADC based on the asymmetry compensation signal from the slicer bias loop. The first adder may be responsive to the first booster. The slicer bias loop may include a bias error detector configured to generate a bias error signal based on the asymmetrically compensated digital output signal from the first adder and the temporary decision signal from the slicer, and a second filter configured to generate the asymmetry compensation signal based on the bias error signal from the bias error detector.

The limit equalizer may include first and second branches arranged in parallel and a second adder connected to the first and second branches. The first branch may include a limiter and a booster arranged in series, and the second branch may include a phase rotator and a first delay arranged in series. The phase detector may include third and fourth branches arranged in parallel and a multiplier connected to the third and fourth branches. The fourth branch may include a third filter. The bias error detector may include fifth and sixth branches arranged in parallel and a multiplier connected to the fifth and sixth branches. The sixth branch may include a fourth filter.

In yet another aspect of the disclosure, a method of generating a timing signal includes steps of converting an analog input signal to a digital output signal, boosting high frequency components of the digital output signal, deriving a temporary decision signal based on the boosted digital output signal, and generating a timing error signal based on the boosted digital output signal and the temporary decision signal.

The method may further include a step of compensating asymmetrical qualities of the digital output signal prior to boosting the high frequency components of the digital output signal. The method may further include a step of boosting the digital output signal prior to compensating the asymmetrical qualities of the digital output signal. The step of boosting the high frequency components of the digital output signal may include the steps of splitting the digital output signal, providing the split digital output signal to first and second signal paths, the first signal path including a limiter and a booster arranged in series, and the second signal path including a phase rotator and a delay arranged in series, and adding outputs from the booster and the delay.

The step of generating the timing error signal may include the steps of filtering the temporary decision signal, and adding the filtered temporary decision signal to the boosted digital output signal. The step of compensating the asymmetrical qualities of the digital output signal may include the steps of generating an asymmetric compensation signal based on the digital output signal and the temporary decision signal, and adding the an asymmetrical compensation signal and the digital output signal. The step of generating asymmetric compensation signal may include the steps of generating a bias error signal based on the digital output signal and the temporary decision signal, and filtering the bias error signal. The step of generating the bias error signal may include the steps of filtering the digital output signal, and multiplying the digital output signal by the temporary decision signal.

In another aspect of the disclosure, a timing loop includes means for boosting high frequency components of a digital output signal from an analog to digital converter (ADC), means for deriving a temporary decision signal based on the digital output signal with the boosted high frequency components, and means for generating a timing error signal based on the boosted digital output signal and the temporary decision signal.

The timing loop may further include means for compensating asymmetrical qualities of the digital output signal based on the temporary decision signal and the digital output signal with the boosted high frequency components. The timing loop may further include means for boosting the digital output signal.

In another aspect of the disclosure, a computer readable medium having a stored computer program embodying instructions, which, when executed by a computer, cause the computer to generate a timing signal for an analog to digital converter (ADC), includes instructions for converting an analog input signal to a digital output signal; instructions for boosting high frequency components of the digital output signal; instructions for deriving a temporary decision signal based on the boosted digital output signal; and instructions for generating a timing error signal based on the boosted digital output signal and the temporary decision signal.

The computer readable medium may further include instructions for compensating asymmetrical qualities of the digital output signal prior to boosting the high frequency components of the digital output signal. The computer readable medium may further include instructions for boosting the digital output signal prior to compensating the asymmetrical qualities of the digital output signal. The instructions for boosting the high frequency components of the digital output signal may include instructions for splitting the digital output signal, instructions for providing the split digital output signal to first and second signal paths, the first signal path comprising a limiter and a booster arranged in series, and the second signal path comprising a phase rotator and a delay arranged in series, and instructions for adding outputs from the booster and the delay.

The instructions for generating the timing error signal may include instructions for filtering the temporary decision signal, and instructions for adding the filtered temporary decision signal by the boosted digital output signal. The instructions for compensating the asymmetrical qualities of the digital output signal may include instructions for generating an asymmetric compensation signal based on the digital output signal and the temporary decision signal, and instructions for adding the asymmetrical compensation signal and the digital output signal. The instructions for generating an asymmetric compensation signal may include instructions for generating a bias error signal based on the digital output signal and the temporary decision signal, and instructions for filtering the bias error signal. The instructions for generating the bias error signal may include instructions for filtering the digital output signal, and instructions for multiplying the digital output signal by the temporary decision signal.

Additional features, advantages, and embodiments of the disclosure may be set forth or apparent from consideration of the following detailed description, drawings, and claims. Moreover, it is to be understood that both the foregoing summary and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings:

FIGS. 6A and 6B show exemplary implementations of a limit equalizer that may be used in the timing loop shown in FIG. 1, constructed according to the principle of the disclosure;

DETAILED DESCRIPTION

Figure 1:
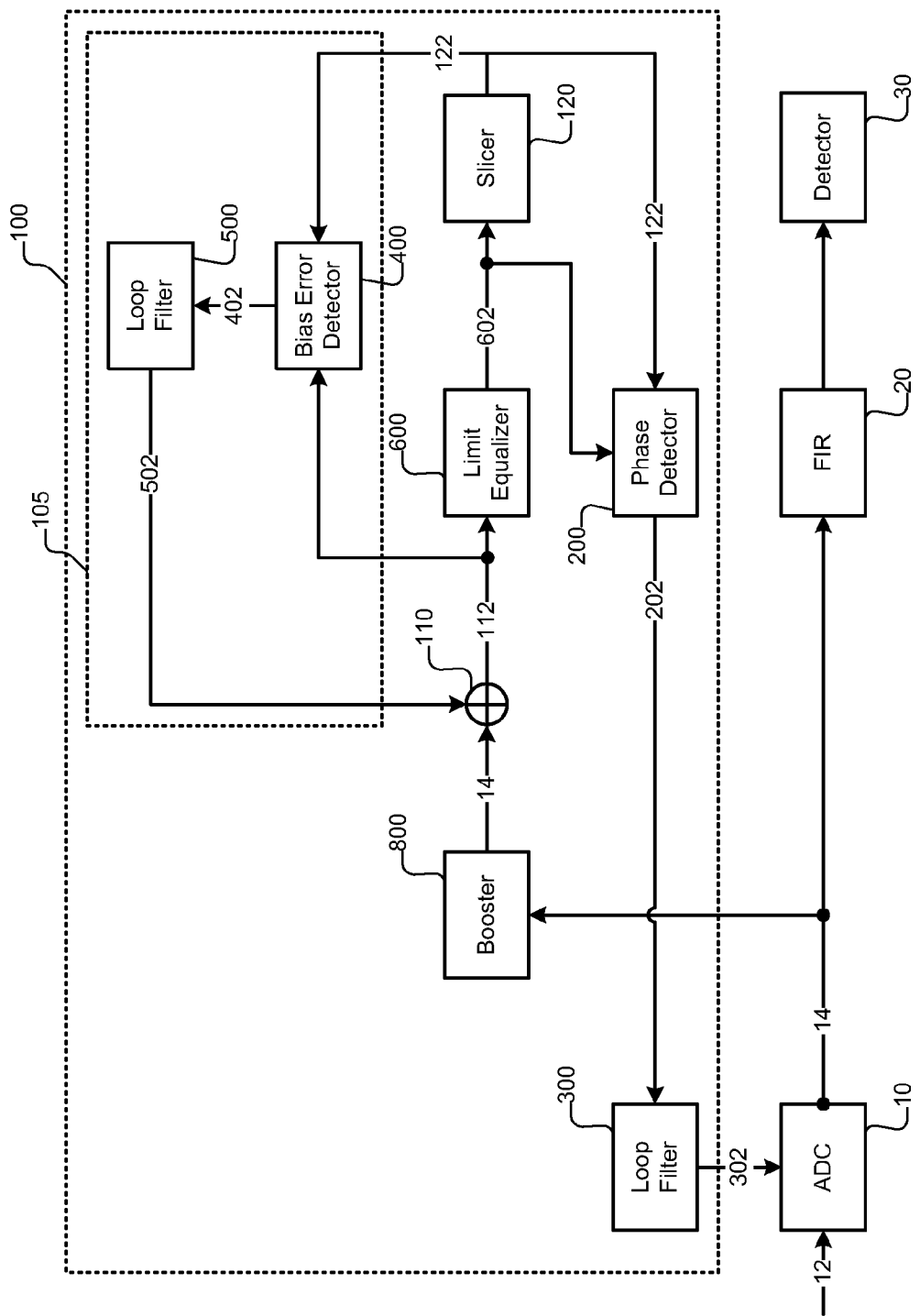
FIG. 1 shows a schematic diagram of a limit equalizer output based timing loop constructed according to the principles of the disclosure.

The embodiments of the disclosure and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure, which is defined solely by the appended claims and applicable law. Moreover, it is noted that like reference numerals reference similar parts throughout the several views of the drawings.

When there is severe inter-symbol interference (ISI) in a timing loop, an analog to digital converter (ADC) output may not cross zero for short mark/space transitions, which may cause excess timing jitter particularly when an asymmetrically compensated ADC output is directly used to drive the timing loop. To solve this problem, according to the principles of the disclosure, a limit equalizer may be used to boost high frequency components without affecting the zero crossing of the low frequency components thereof. This may significantly improve the performance when there is severe ISI or other signal related problems. Furthermore, since the timing loop is based on the limit equalizer output, the timing loop is independent of the partial response (PR) target and has no interaction with an adaptive filter, thereby lifting the burden of designing a well constrained adaptive filter such as a finite impulse response (FIR) filter.

With this in mind, FIG. 1 shows a schematic diagram of a limit equalizer output based timing loop circuit constructed according to the principles of the disclosure, for generating a channel clock to drive an analog to digital converter (ADC) 10. The timing loop circuit may include an analog to digital converter (ADC) 10, a filter 20, a detector 30 and a timing generation and compensation circuit 100. As well known in the art, the ADC 10 may be used to receive an analog input 12 and convert it to a digital output 14. For example, the analog input 12 may be an input from a PDIC (photo detector IC) of an optical disk storage device (not shown). Another input to the ADC 10 may be a timing and/or timing recovery signal, such as a channel clock signal (ADC CLK) 302 from the timing generation and compensation circuit 100. The timing generation and compensation circuit 100 may use the digital output 14 from the ADC 12 to generate the timing generation signal ADC CLK 302, as described in detail below.

The timing generation and compensation circuit 100 may perform at least two functions. First, the circuit 100 may be used to compensate the analog input signal 12, which may be asymmetrical and/or non-linear, for example, and may be generated from an optical storage device. Second, the circuit 100 may also be used to provide timing and/or timing error recovery for the ADC CLK signal 302. Thus, the resultant ADC CLK signal 302 may have improved timing and/or timing recovery in terms of driving the ADC 10. The digital output 14 may be provided to the filter 20, for example, a finite impulse response (FIR) filter, for equalization and then provided to the detector 30, such as a Viterbi detector, for detecting the features of the signal thereof. Compared to conventional designs, in which the timing loop is coupled to the output from the filter 20 which causes phase distortion and other problems, the timing loop of the disclosure may be decoupled from the filter 20 and the phase distortion problem may be substantially eliminated. Moreover, the circuit configuration may be independent of partial response (PR) targets. Finally, the timing generation and compensation circuit 100 may reduce deterioration caused by non-linearity when reading an optical storage device.

As further shown in FIG. 1, the timing generation and compensation circuit 100 may be configured with a phase detector 200, a first loop filter 300, a bias error detector 400, a second loop filter 500, a limit equalizer 600, an optional booster 800, an adder 110 and a slicer 120. The digital booster 800 may be optionally implemented before slicer bias compensation takes place especially when no analog booster is present. Although FIG. 1 shows the booster 800 arranged before the adder 110, the booster 800 may be arranged after the adder 110. The timing generation and compensation circuit 100 may include a slicer bias loop 105, which may include the bias error detector 400 and the loop filter 500, and may compensate the asymmetry present in the digital output 14. The asymmetry-compensated output 112 is then equalized by the limit equalizer 600 and passed through the slicer 120 to obtain temporary decisions 122 regarding channel data from a read channel, which may be from an optical storage device as is well known in the art. In the related U.S. patent application Ser. No. 11/775,757, the asymmetry-compensated output and the temporary decisions are two inputs to the phase detector. However, according to the disclosure, the equalizer output 602 and the temporary decisions 122 may be used as inputs to the phase detector 200. Based on the equalizer output 602 and the temporary decisions 122, the phase detector 200 may derive a timing error output 202, which may be then filtered by the first loop filter 300 and used as an error signal for the timing loop. The individual components of the circuit 100 are discussed in more detail below.

The slicer bias loop 105 may include the bias error detector 400 and the second loop filter 500. The bias error detector 400 receives the outputs 112, 122 from the adder 110 and the slicer 120, respectively. The bias error detector 400 may detect the zero crossing point from the two inputs 112, 122 to determine the bias error. The bias error detector 400 then may output the bias error output 402 to the second loop filter 500 which may provide a feedback output 502 to the adder 110. The resultant signal of the feedback output 502 may be provided to the adder 110 to increase the performance of the timing loop to compensate for the asymmetry or the non-linearity found in, for example, optical storage devices. The other input to the adder 110 comes from the output 14 of the ADC 10. Thus, the adder 110 sums the output signal 14 from the ADC 10 with the feedback output 502 from the second filter 500 of the slicer bias loop 105. The asymmetry-compensated output 112 from the adder 110 is provided to and equalized by the limit equalizer 600. The output 602 of limit equalizer 600 is provided to the slicer 120. The slicer 120 has two outputs. The first output of the slicer 210 may be provided to the bias error detector 400, and the second output may be provided to the phase detector 200. The first loop filter 300 smoothes the timing error signal 202 to generate the ADC clock signal 302 to drive the ADC 10. More specific examples of the individual components of the above circuits are set out below.

Figure 2:
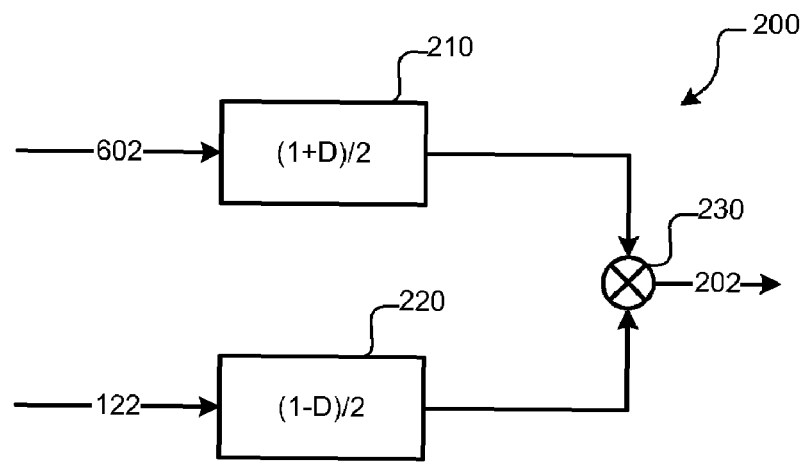
FIG. 2 shows an exemplary implementation of a phase detector that may be used in the timing loop shown in FIG. 1, constructed according to the principles of the disclosure.

FIG. 2 shows an exemplary implementation of the phase detector 200. However, any known arrangement and/or implementation of a phase detector may be employed with the disclosure. As shown in FIG. 1, the phase detector 200 has two inputs: (a) the output 602 (i.e., samples signal) from the limit equalizer 600 and (b) the output 122 from the slicer 120. The samples signal 602 may be input to a phase shifter 210, which may shift the phase of the samples signal 602 by $(1+D)/2$ where the component D is the unit delay as is well known in the art. Thus, phase shifter 210 shifts the phase of the signal bit 0.5 T (where T=1/f and f=frequency). A filter 220 may be used to find the transitions. An output of "0" may indicate that there is no transition. Conversely, an output of "−1" may be indicative of a negative transition. Finally, an output of "1" may be indicative of a positive transition. The outputs of the phase shifter 210 and the filter 220 may be input to a multiplier 230, as is well known in the art. The resultant output of the multiplier 230 is the sample values at zero crossing which may be used as timing error signal 202 used to drive the ADC clock signal 302 as previously discussed in conjunction with FIG. 1 noted above. The timing error signal 202 may provide an indication of the amount of timing shift that needs to be compensated.

Figure 3:
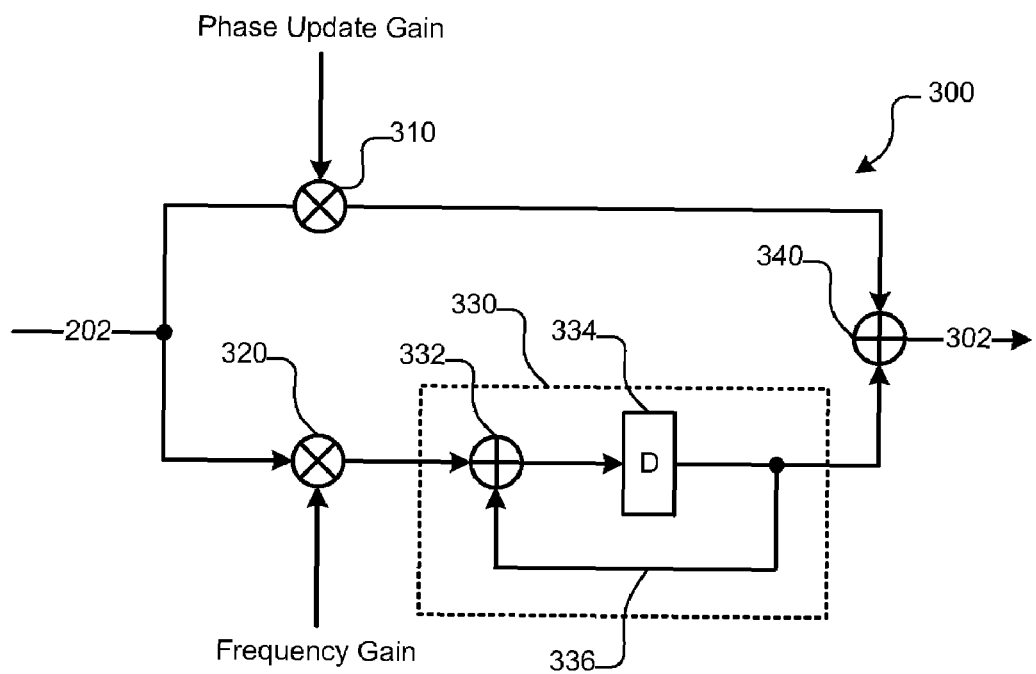
FIG. 3 shows an exemplary implementation of a first loop filter that may be used in the timing loop shown in FIG. 1, constructed according to the principles of the disclosure.

FIG. 3 shows an exemplary implementation of the first loop filter 300, which receives the output 202 from the phase detector 200 shown in FIG. 2. The phase detector output 202 is split into two separate branches for input to the first multiplier 310 and the second multiplier 320. In particular, the first multiplier 310 may receive a phase update gain and the second multiplier 320 may receive a frequency gain. The filter 300 further includes an accumulator 330 that receives the output from the second multiplier 320. The accumulator 330 may include an adder 332 and a delay 334. The output of the delay 334 is fed back along a feedback loop 336 to the adder 332. Moreover, the output of the delay 334 is also fed to an adder 340. The output of the multiplier 310 may also be fed to the adder 340, whose output is used by VCO (which is not shown here) to generate the ADC clock signal 302 to drive the ADC 10.

Figure 4:
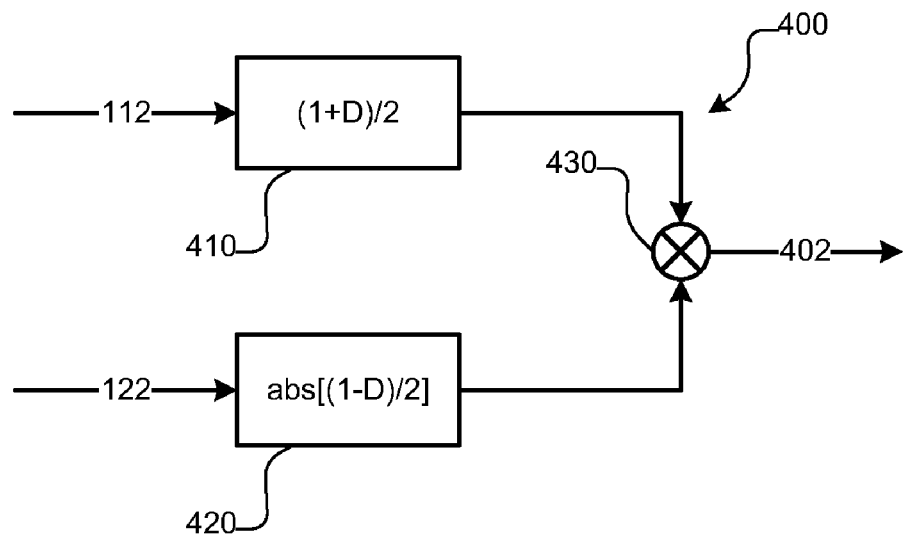
FIG. 4 shows an exemplary implementation of a bias error detector that may be used in the timing loop show in FIG. 1, constructed according to the principle of the disclosure.

FIG. 4 shows an exemplary implementation of the bias error detector 400. However, it should be noted that any type of bias error detector known in the art may be employed. The bias error detector 400 includes two inputs as noted above. The first sample input is the ADC output 112 that has been asymmetry-compensated by the adder 110. The first input is provided to a phase shifter 410 to obtain the sample values at zero crossing point from the ADC samples that are sampled at peaks. The second input is the output 122 from the slicer 120. The second input is provided to a filter 420, which may take the absolute value of a previous transition value of $(1-D)/2$. The resultant output of the filter 420 may be "0" indicating no transition or "1" indicating a transition. The outputs from the phase shifter 410 and filter 420 may be combined by a multiplier 402. The output 402 of the multiplier 430 may be a sample value at zero crossing and may be used to indicate the bias error and may be input to the second loop filter 500, as noted above.

Figure 5A:
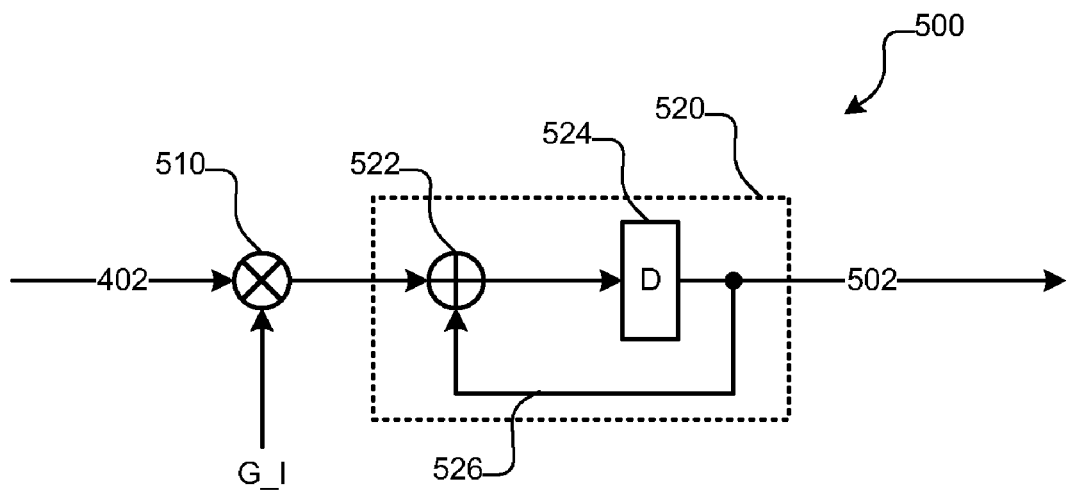
FIGS. 5A and 5B show exemplary implementations of a second loop filter that may be used in the timing loop shown in FIG. 1, constructed according to the principle of the disclosure.
Figure 5B:
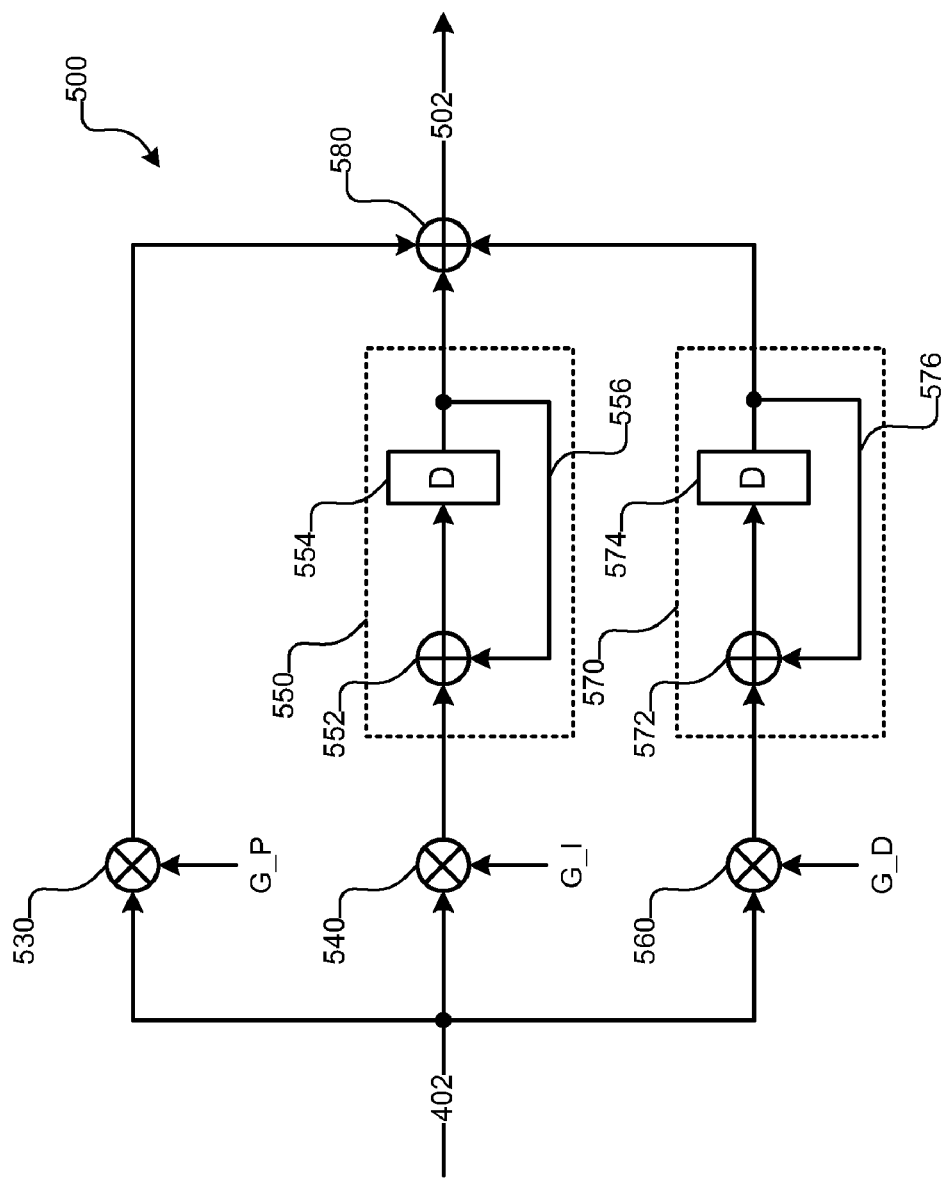

FIGS. 5A and 5B show exemplary implementations of the second loop filter 500 that may be implemented as an integrated loop filter for slicer bias control. However, it should be noted that any type of loop filter known in the art may be employed. In FIG. 5A, the filter 500 may include a multiplier 510 which multiplies the output 402 from the bias error detector 400 by a user programmable constant G_I. The resultant output of the multiplier 510 is then provided to an accumulator 520, which may employ an adder 522 and a delay 524 to accumulate the signal magnitude. The output from the delay 524 is fed back along a loop 526 back to the adder 522. Alternatively, FIG. 5B shows a Proportional Integral Derivative (PID) loop filter which may be used as the second loop filter 500 in the slicer bias loop 105. The input 402 from the bias error detector 400 is divided into three separate branches. In the first branch, a multiplier 530 multiplies the output 402 from the bias error detector 400 by a user programmable constant G_P. The output of the multiplier 530 is fed to an adder 580, which sums the output of all three branches. The second branch is first fed to a multiplier 540, together with a user programmable constant G_I. The output of the multiplier 540 is fed to an accumulator 550, which may be implemented with an adder 552 and a delay 554 to accumulate the signal. The output from the delay 554 is fed back via a loop 556 back to the adder 552. The resultant output of the accumulator 550 is provided to the adder 580. The third input branch may be identically implemented as the second branch, such as a multiplier 560 and an accumulator 570, except that the multiplier 560 is provided with a different user programmable constant G_D instead of the constant G_I. The adder 580 combines the outputs of all three branches to generate a filtered output 502. The skilled artisan will appreciate that the implementation shown in FIG. 5A is a special case of the implementation shown in FIG. 5B with the G_P and G_D values set to zero.

FIGS. 6A and 6B show exemplary implementations of the limit equalizer 600. In FIG. 6A, the input 112 from the adder 110 may be split into an upper branch and a lower branch. The outputs from the upper branch and the lower branch may then be combined by an adder 630. The upper branch of the limit equalizer 600 includes a phase rotator 610, which may adjust the phase of the input signal by (1+D)/2 to shift the phase by 0.5 T. The output of the phase rotator 610 may be input to a limiter 612, of which the threshold may limit the boost range for the input signal. Finally, the output of the limiter 612 may be input to a booster 614 for high frequency boost, such as a [−1 1 1 −1] boost. The output of the booster 614 may be input to the adder 630. The lower branch of the limit equalizer 600 is provided with a pair of delay circuits 620, 622 arranged in series. The output from the delay circuits 620, 622 may be combined with the output of the upper branch by the adder 630 to provide the limit equalization function.

Figure 7A:
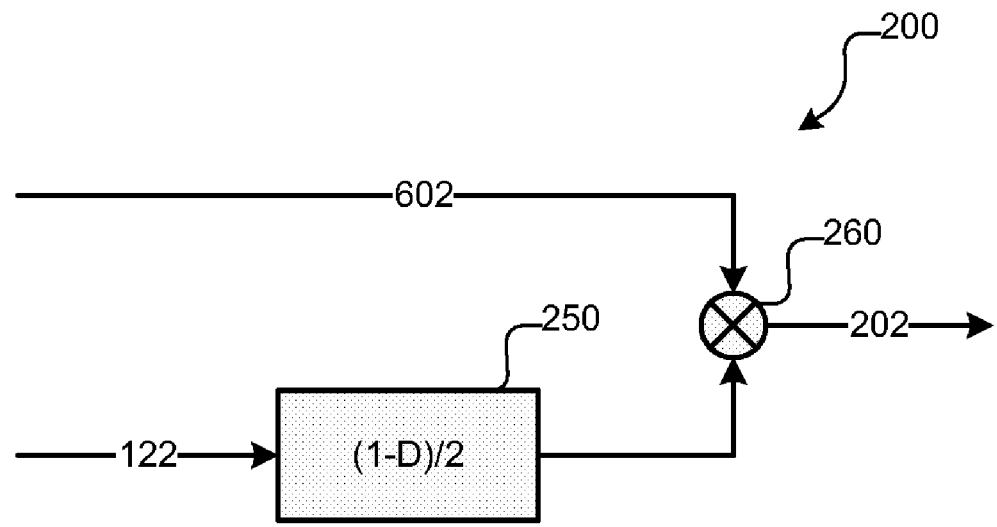
FIG. 7A shows another exemplary implementation of the phase detector that may be used in the timing loop shown in FIG. 1, constructed according to the principle of the disclosure.
Figure 7B:
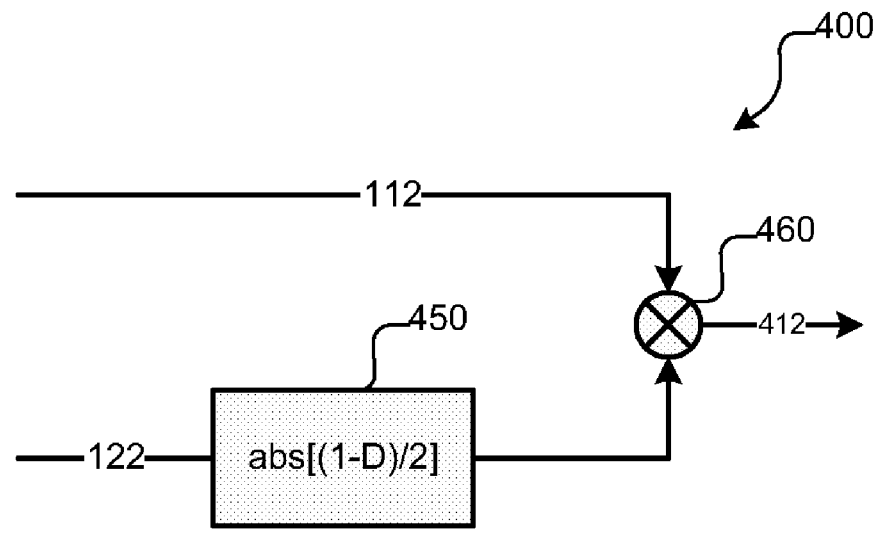
FIG. 7B shows another exemplary implementation of the bias error detector that may be used in the timing loop shown in FIG. 1, constructed according to the principle of the disclosure.

FIG. 6B shows another implementation of the limit equalizer 600, constructed according to the principles of the disclosure, which may be used in connection with the implementations of the phase detector 200 and bias error detector 400 shown in FIGS. 7A and 7B, respectively. Compared to the implementation shown in FIG. 6A, a phase rotator 650 is arranged at the lower branch before a delay 652. The upper branch may include a limiter 640 and booster 642. The input signal 112 provided to the upper branch is processed by the limiter 640 and booster 642 in the aforementioned manner. The input signal 112 provided to the lower branch is first processed by the phase rotator 650, which may adjust the phase of the input signal by (1+D)/2 to shift the phase by 0.5 T, and then provided to the delay 652. The outputs from the upper and lower branch are combined by an adder 660 to generate a limit equalizer output 602.

As mentioned above, the implementation of the limit equalizer 600 shown in FIG. 6B may require modification of the phase detector 200 and bias error detector 400. For example, FIGS. 7A and 7B show another implementations of the phase detector 200 and bias error detector 400, respectively, which may be used in connection with the limit equalizer 600 shown in FIG. 6B. More specifically, in FIG. 7A, the phase detector 200 has two inputs: (a) the output 602 from the limit equalizer 600 and (b) the output 122 from the slicer 120. Compared to the implementation shown in FIG. 2, no phase shifter is provided for shifting the phase of the samples signal 602. Instead, the sample signal 602 is directly provided to a multiplier 260. A filter 250 is used to find the transitions, as mentioned above in connection with FIG. 2. The samples signal 602 and the output of the filter 220 are provided to the multiplier 260. The resultant output of the multiplier 260 is the sample values at zero crossing which may be used as the timing error signal 202 used to drive the ADC clock signal 302 as previously discussed in conjunction with FIG. 1 noted above.

In FIG. 7B, the bias error detector 400 may be implemented without a phase shifter for obtaining the sample values at zero crossing point from the ADC samples that are sampled at peaks, and the sample output 112 is directly provided to a multiplier 460. The second input is the output 122 from the slicer 120. The second input is provided to a filter 450, which may take the absolute value of a previous transition value of (1−D)/2. The resultant output of the filter 450 may be "0" indicating no transition or "1" indicating a transition. The output from the filter 450 and signal 112 may be combined by a multiplier 460. The output 412 of the multiplier 460 is a sample value at zero crossing and may be used to indicate the bias error and may be input to the second loop filter 500, as noted above.

Figure 8:
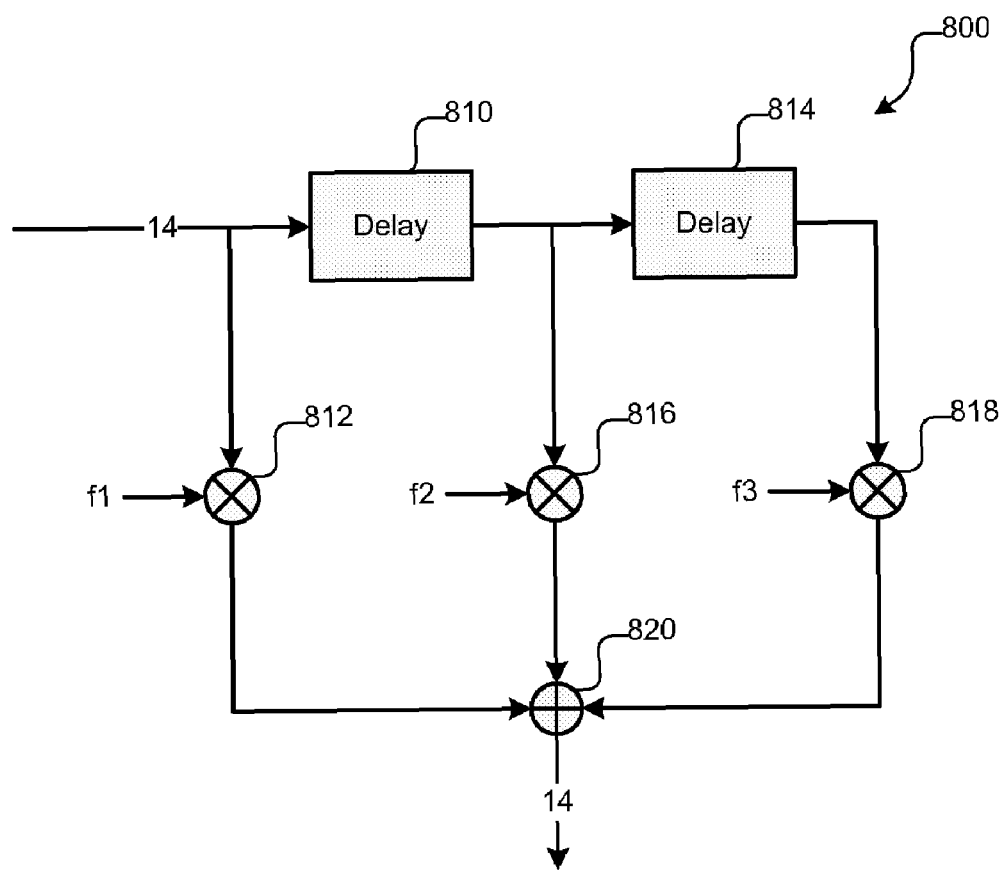
FIG. 8 shows an exemplary implementation of a booster that may be used in the timing loop show in FIG. 1, constructed according to the principle of the disclosure.

FIG. 8 shows an exemplary implementation of the booster 800 shown in FIG. 1. However, it should be noted that any type of loop filter known in the art may be employed. As mentioned above, the digital booster 800 may be optionally implemented before the slicer bias compensation takes place especially when no analog booster is present. Also, the booster 800 is shown arranged before the adder 110, the booster 800 may alternatively be arranged between the adder 110 and the limit equalizer 600. As shown in FIG. 8, the booster 800 may be implemented as a three-tap finite impulse response (FIR) filter with delays 810, 814, multiplier 812, 816, 818 and an adder 820. The three tap weights are denoted as f1, f2 and f3. The output 14 from the ADC 10 is provided as input to the booster 800. The input 14 is then split into three branches; left, center and right branches. The input 14 provided to the left branch is combined with the tap weight f1 by the multiplier 812 and provided to the adder 820. The input 14 provided to the center branch is processed by the delay 810, combined with the tap weight f2 by the multiplier 816 and then may be provided to the adder 820. The output from the delay 810 is also provided to the right branch including the delay 814 and multiplier 818. The output from the delay 814 is combined with the tap weight f3 by the multiplier 818 and provided to the adder 820. For example, the f1, f2 and f3 input may be −0.125, 1 and −0.125, respectively. The outputs from the left, center and right branches are combined by the adder 816 to generate a boosted sample signal 14.

As described above, a limit equalizer may be used to boost the high frequency components without touching the zero crossing of the low frequency components thereof. This may significantly improve the performance when there is severe ISI. Furthermore, since the timing loop is based on the limit equalizer output, the timing loop is independent of the partial response (PR) target and has no interaction with an adaptive filter, thereby lifting the burden of designing a well constrained adaptive finite impulse response (FIR) filter.

Figure 9:
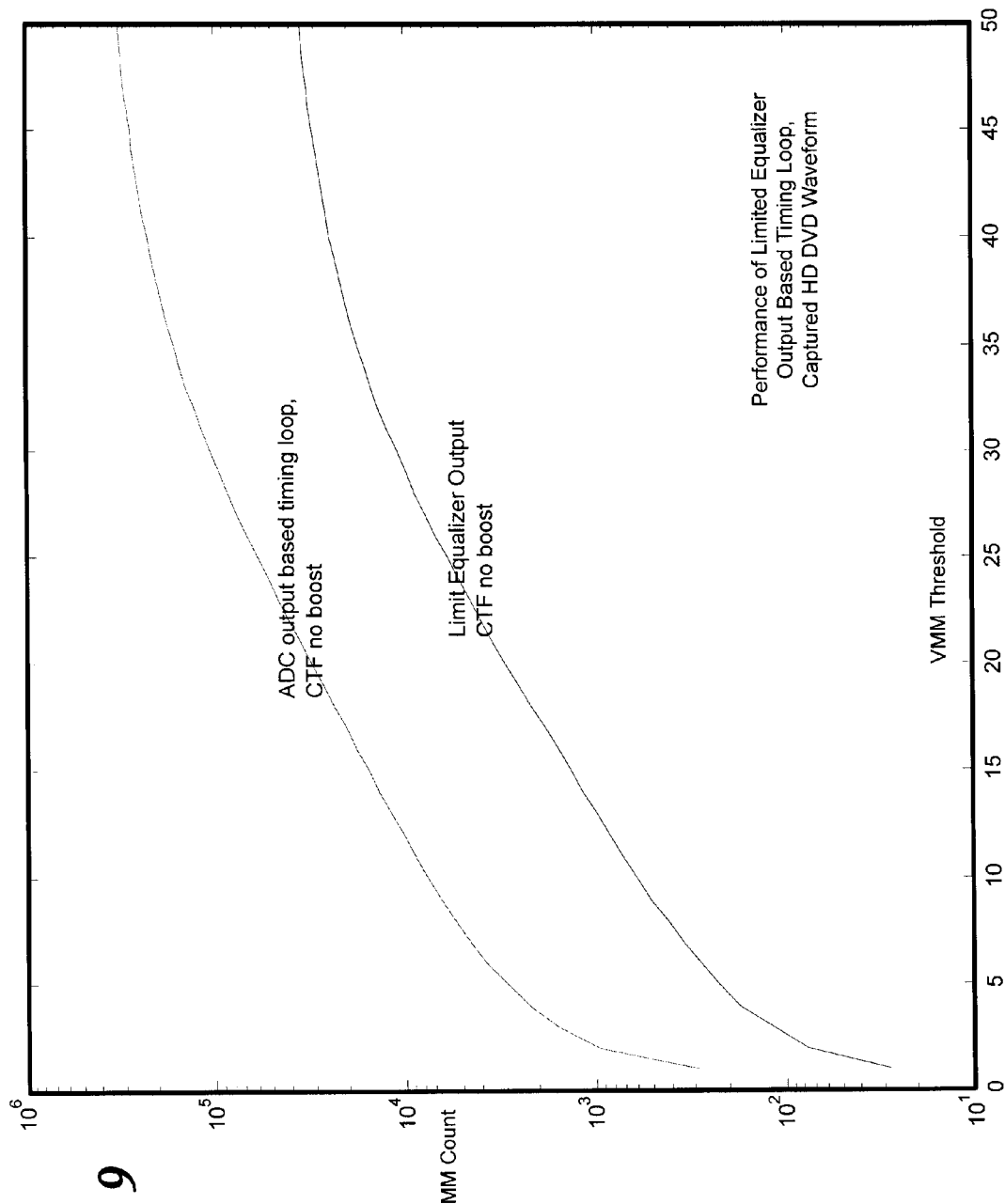
FIG. 9 is a line chart of VMM count vs. VMM threshold visualizing the performance of the limit equalizer output based timing loop shown in FIG. 1.

FIG. 9 is a line chart of VMM count vs. VMM threshold visualizing the performance of the limit equalizer output based timing loop. More specifically, FIG. 9 shows the improved performance of the invention.

Figure 10:
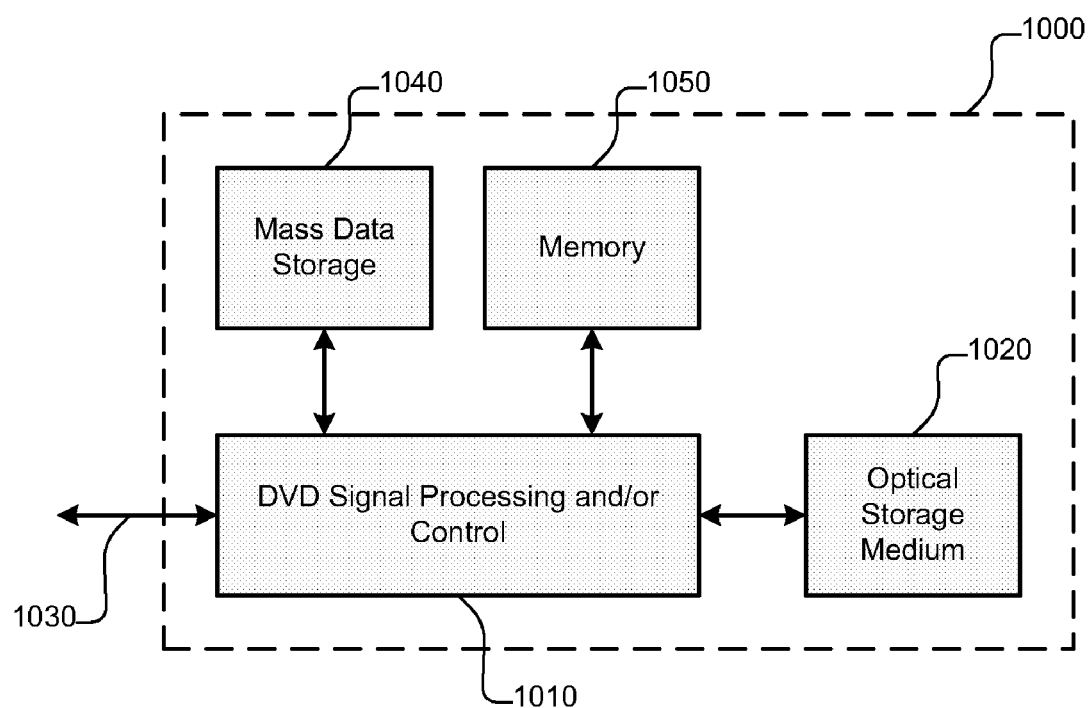
FIG. 10 shows an exemplary application of the limit equalizer output based timing loop in FIG. 3 implemented in a DVD player, constructed according to the principles of the invention.

Referring now to FIGS. 10, 11, 12, 13, 14, 15 and 16, various exemplary applications of the disclosure are shown. Referring first to FIG. 10, the disclosure may be embodied in a digital versatile disc (DVD) drive 1000. The disclosure may implement either or both DVD signal processing and/or control circuits 1010 and/or mass data storage 1040 of the DVD drive 1000. The DVD signal processing and/or control circuit 1010 and/or other circuits (not shown) in the DVD drive 1000 may process data, perform coding and/or encryption, perform calculations, and/or format data that is read from and/or data written to an optical storage medium 1020. In some implementations, the signal processing and/or control circuit 1010 and/or other circuits (not shown) in the DVD drive 1000 can also perform other functions such as encoding and/or decoding and/or any other signal processing functions associated with a DVD drive.

The DVD drive 1000 may communicate with an output device (not shown) such as a computer, television or other device via one or more wired or wireless communication links 1030. The DVD drive 1000 may communicate with a mass data storage 1040 that stores data in a nonvolatile manner. The DVD drive 1000 may be connected to a memory 1050, such as RAM, ROM, low latency nonvolatile memory such as flash memory, and/or other suitable electronic data storage.

Figure 11:
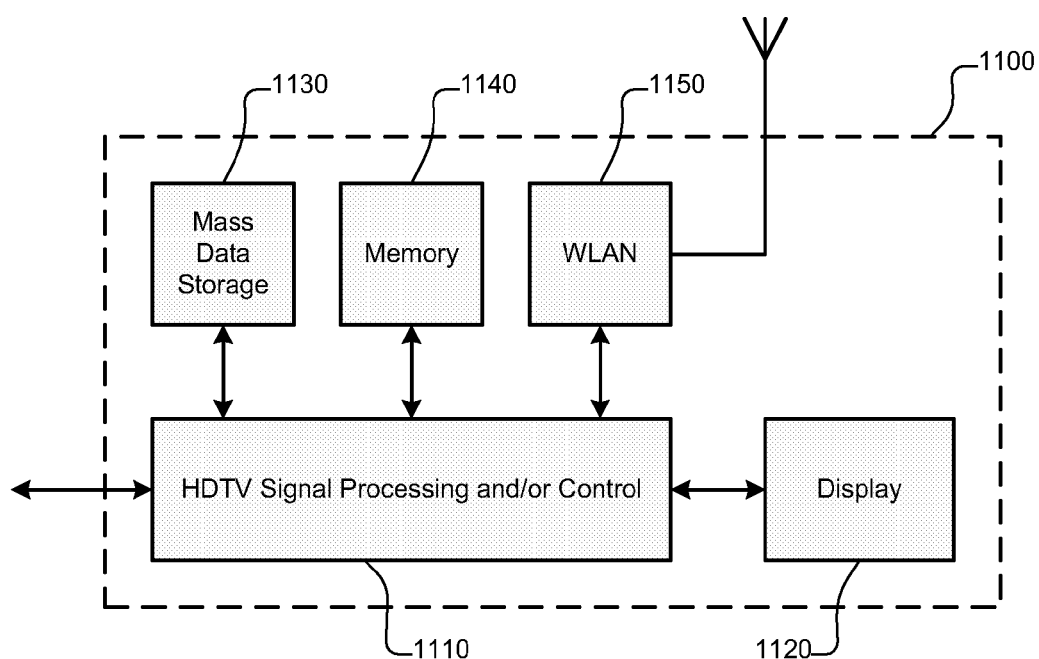
FIG. 11 shows an exemplary application of the limit equalizer output based timing loop in FIG. 3 implemented in a HDTV, constructed according to the principles of the invention.

Referring now to FIG. 11, the disclosure may be embodied in a high definition television (HDTV) 1100. The disclosure may implement either or both HDTV signal processing and/or control circuits 1110, a WLAN interface 1150 and/or mass data storage 1130 of the HDTV 1100. The HDTV 1100 receives HDTV input signals in either a wired or wireless format and generates HDTV output signals for a display 1120. In some implementations, the HDTV signal processing circuit and/or control circuit 1110 and/or other circuits (not shown) of the HDTV 1100 may process data, perform coding and/or encryption, perform calculations, format data and/or perform any other type of HDTV processing that may be required.

The HDTV 1100 may communicate with the mass data storage 1130 that stores data in a nonvolatile manner such as optical and/or magnetic storage devices. The HDTV 1100 may be connected to a memory 1140 such as RAM, ROM, low latency nonvolatile memory such as flash memory and/or other suitable electronic data storage. The HDTV 1100 also may support connections with a WLAN via the WLAN network interface 1150.

Figure 12:
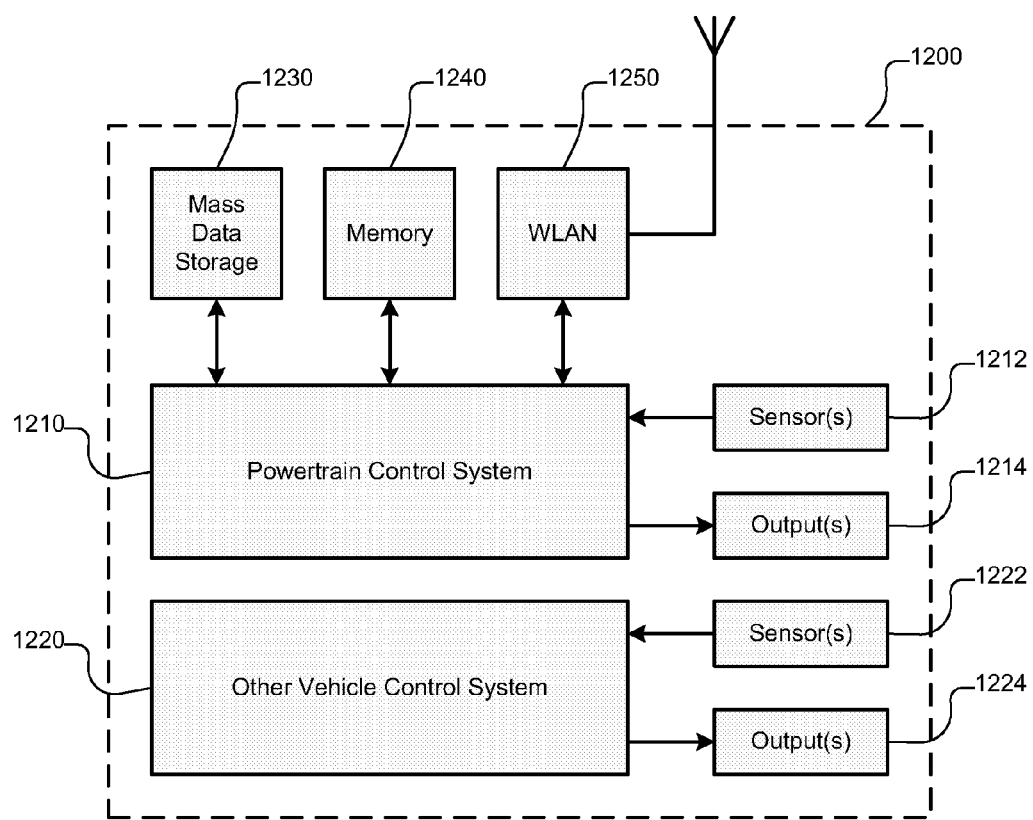
FIG. 12 shows an exemplary application of the limit equalizer output based timing loop in FIG. 3 implemented in a vehicle, constructed according to the principles of the invention.

Referring now to FIG. 12, the disclosure may be implemented in a mass storage device 1230 of a vehicle 1200, which may include a powertrain control system 1210, other vehicle control system 1220, memory 1240, a WLAN interface 1250. The powertrain control system 1210 receives inputs from one or more sensors 1212 such as temperature sensors, pressure sensors, rotational sensors, airflow sensors and/or any other suitable sensors and/or that generates one or more output control signals from an output 1214 such as engine operating parameters, transmission operating parameters, and/or other control signals.

The other control systems 1220 may likewise receive signals from input sensors 1222 and/or output control signals to one or more output devices 1224. In some implementations, the control system 1220 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The disclosure may be implemented in the mass data storage 1230 that stores data in a nonvolatile manner. The mass data storage 1230 may include optical and/or magnetic storage devices for example hard disk drives (HDD) and/or DVDs. At least one DVD may have the configuration shown in FIG. 10. The powertrain control system 1210 may be connected to the memory 1240 such as RAM, ROM, low latency nonvolatile memory such as flash memory and/or other suitable electronic data storage. The powertrain control system 1210 also may support connections with the WLAN via the WLAN network interface 1250. The control system 1220 may also include mass data storage, memory and/or a WLAN interface (all not shown).

Figure 13:
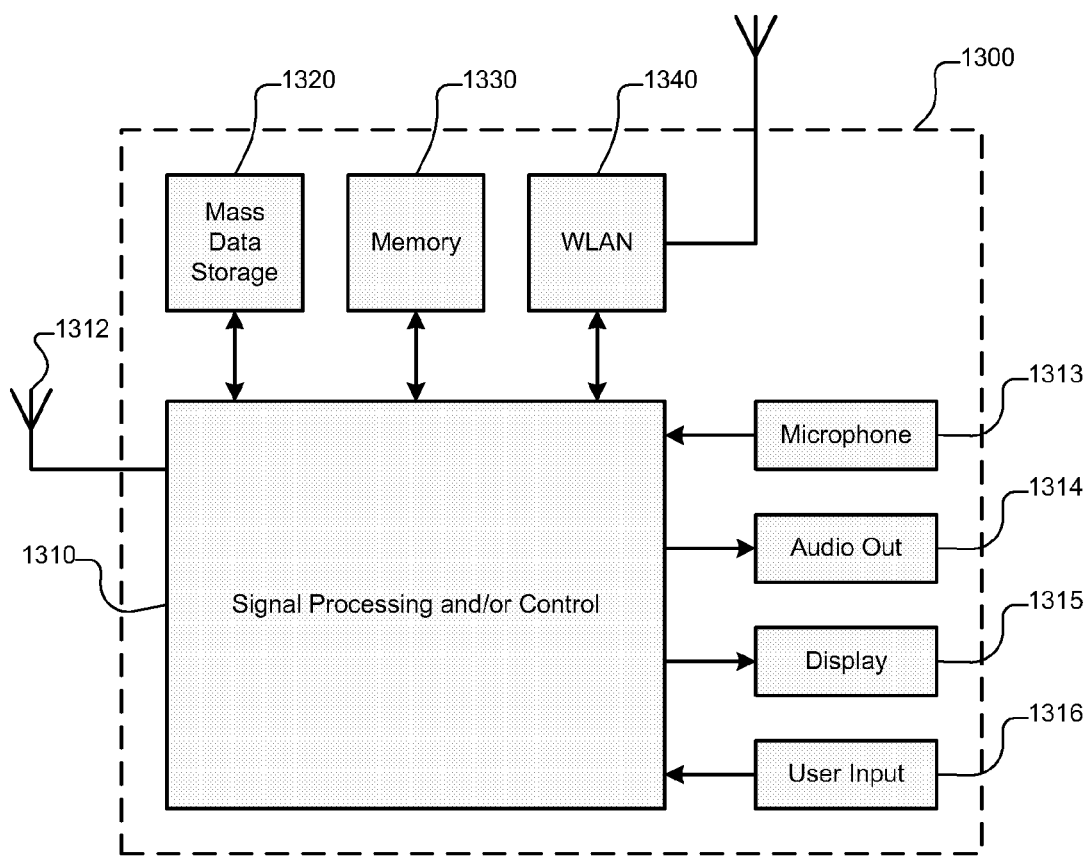
FIG. 13 shows an exemplary application of the limit equalizer output based timing loop in FIG. 3 implemented in a cellular phone, constructed according to the principles of the invention.

Referring now to FIG. 13, the disclosure may be embodied in a cellular phone 1300 that may include a cellular antenna 1312. The disclosure may implement either or both signal processing and/or control circuits 1310, a WLAN interface 1340 and/or mass data storage of the cellular phone 1320. In some implementations, the cellular phone 1300 includes a microphone 1313, an audio output 1314 such as a speaker and/or audio output jack, a display 1315 and/or an input device 1316 such as a keypad, pointing device, voice actuation and/or other input device. The signal processing and/or control circuits 1310 and/or other circuits (not shown) in the cellular phone 1300 may process data, perform coding and/or encryption, perform calculations, format data and/or perform other cellular phone functions.

The cellular phone 1300 may communicate with the mass data storage 1320 that stores data in a nonvolatile manner such as optical and/or magnetic storage devices for example HDDs and/or DVDs. At least one DVD may have the configuration shown in FIG. 10. The cellular phone 1300 may be connected to a memory 1330 such as RAM, ROM, low latency nonvolatile memory such as flash memory and/or other suitable electronic data storage. The cellular phone 1300 also may support connections with a WLAN via the WLAN network interface 1340.

Figure 14:
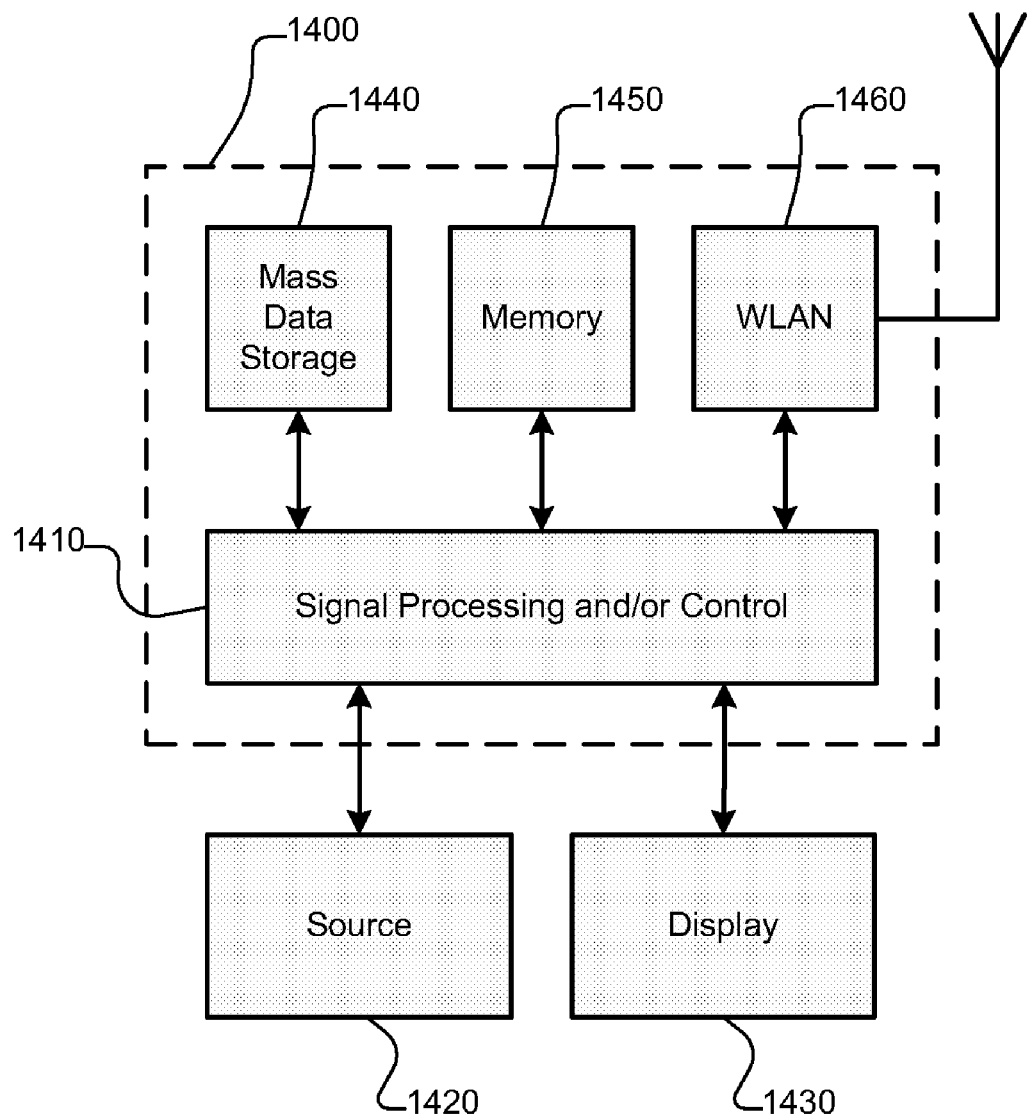
FIG. 14 shows an exemplary application of the limit equalizer output based timing loop in FIG. 3 implemented in a set-top box, constructed according to the principles of the invention.

Referring now to FIG. 14, the disclosure may be embodied in a set top box 1400. The disclosure may implement either or both signal processing and/or control circuits 1410, a WLAN interface 1460 and/or a mass data storage 1440 of the set top box 1400. The set top box 1400 receives signals from a source 1420 such as a broadband source and outputs standard and/or high definition audio/video signals suitable for a display 1430 such as a television and/or monitor and/or other video and/or audio output devices. The signal processing and/or control circuits 1410 and/or other circuits (not shown) of the set top box 1400 may process data, perform coding and/or encryption, perform calculations, format data and/or perform any other set top box function.

The set top box 1400 may communicate with the mass data storage 1440 that stores data in a nonvolatile manner. The mass data storage 1440 may include optical and/or magnetic storage devices for example hard disk drives HDD and/or DVDs. At least one DVD may have the configuration shown in FIG. 10. The set top box 1400 may be connected to a memory 1450 such as RAM, ROM, low latency nonvolatile memory such as flash memory and/or other suitable electronic data storage. The set top box 1400 also may support connections with a WLAN via the WLAN network interface 1460.

Figure 15:
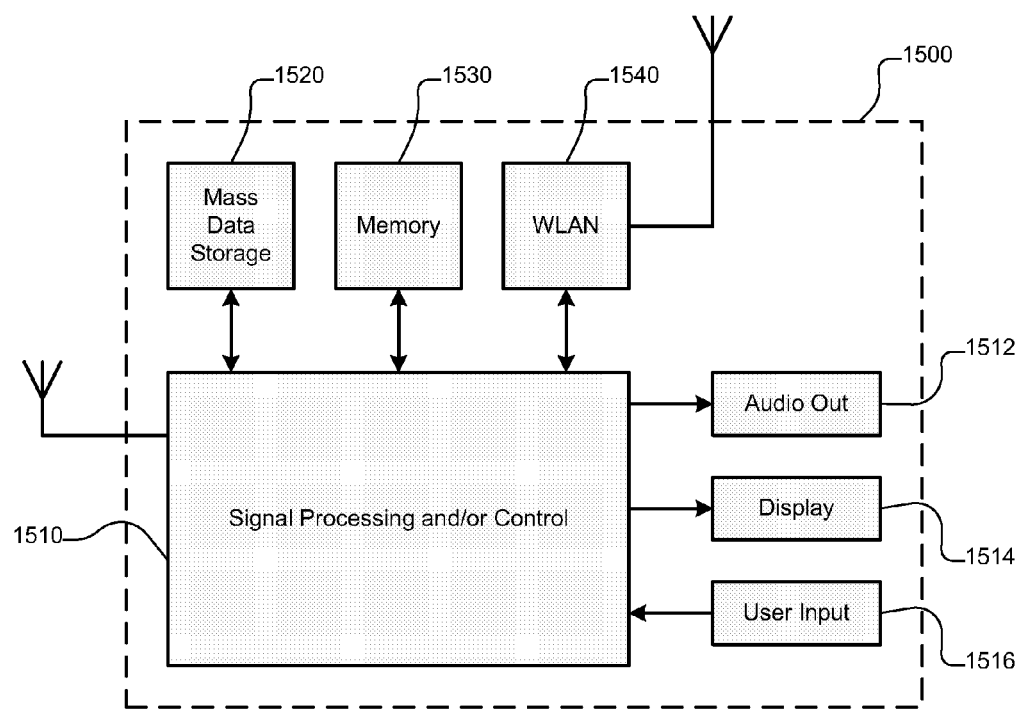
FIG. 15 shows an exemplary application of the limit equalizer output based timing loop in FIG. 3 implemented in a media player, constructed according to the principles of the invention.

Referring now to FIG. 15, the disclosure may be embodied in a media player 1500. The disclosure may implement either or both signal processing and/or control circuits 1510, a WLAN interface 1540 and/or a mass data storage 1520 of the media player 1500. In some implementations, the media player 1500 includes a display 1514 and/or a user input 1516 such as a keypad, touchpad and the like. In some implementations, the media player 1500 may employ a graphical user interface (GUI) that typically employs menus, drop down menus, icons and/or a point-and-click interface via the display 1514 and/or user input 1516. The media player 1500 may further include an audio output 1512 such as a speaker and/or audio output jack. The signal processing and/or control circuits 1510 and/or other circuits (not shown) of the media player 1500 may process data, perform coding and/or encryption, perform calculations, format data and/or perform any other media player function.

The media player 1500 may communicate with the mass data storage 1520 that stores data such as compressed audio and/or video content in a nonvolatile manner. In some implementations, the compressed audio files include files that are compliant with MP3 format or other suitable compressed audio and/or video formats. The mass data storage 1520 may include optical and/or magnetic storage devices, for example, HDD and/or DVDs. At least one DVD may have the configuration shown in FIG. 10. The media player 1500 may be connected to a memory 1530 such as RAM, ROM, low latency nonvolatile memory such as flash memory and/or other suitable electronic data storage. The media player 1500 also may support connections with a WLAN via the WLAN network interface 1540.

Figure 16:
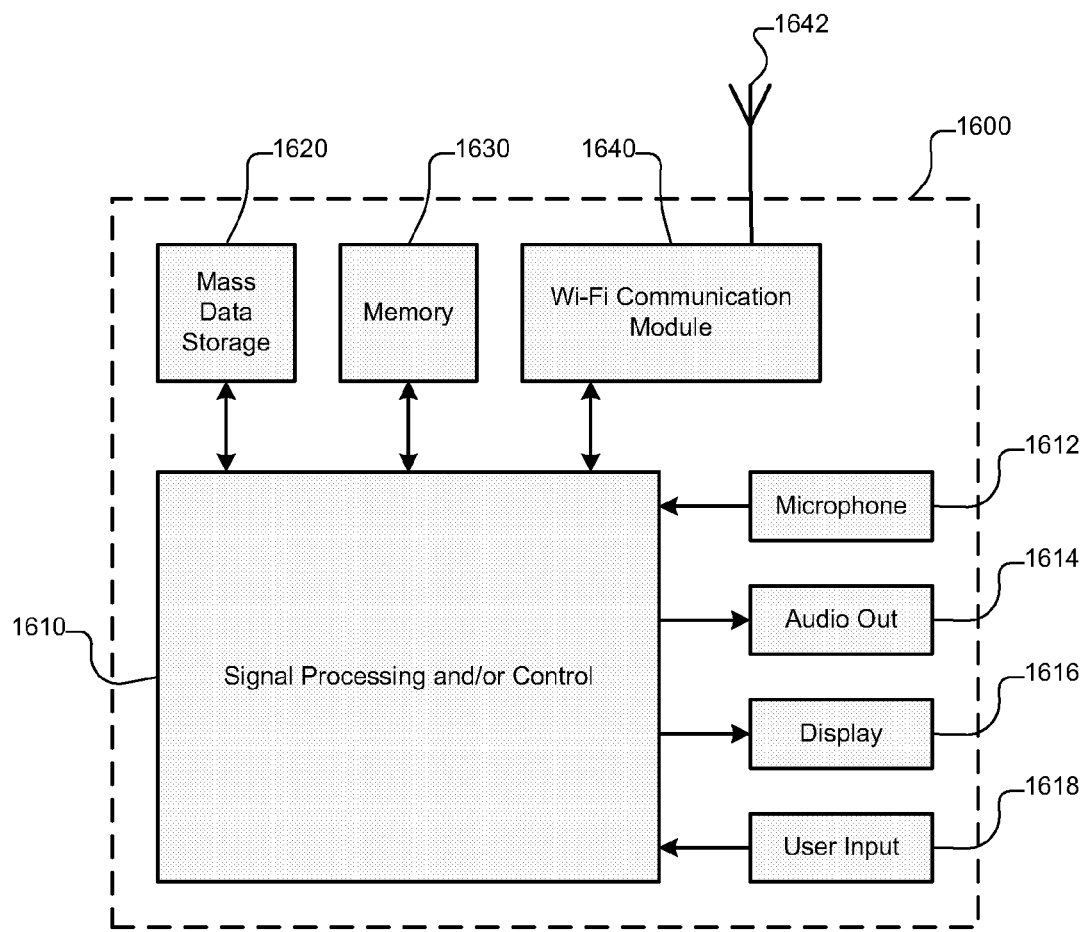
FIG. 16 shows an exemplary application of the limit equalizer output based timing loop in FIG. 3 implemented in a VoIP phone, constructed according to the principles of the invention.

Referring to FIG. 16, the disclosure may be embodied in a Voice over Internet Protocol (VoIP) phone 1600 that may include an antenna 1642. The disclosure may implement either or both signal processing and/or control circuits 1610, a Wireless Fidelity (Wi-Fi) communication module 1640 and/or a mass data storage 1620 of the VoIP phone 1600. In some implementations, the VoIP phone 1600 includes, in part, a microphone 1612, an audio output 1614 such as a speaker and/or audio output jack, a display monitor 1616, an input device 1618 such as a keypad, pointing device, voice actuation and/or other input devices, and the Wi-Fi communication module 1640. The signal processing and/or control circuits 1610 and/or other circuits (not shown) in the VoIP phone 1600 may process data, perform coding and/or encryption, perform calculations, format data and/or perform other VoIP phone functions.

The VoIP phone 1600 may communicate with the mass data storage 1620 that stores data in a nonvolatile manner such as optical and/or magnetic storage devices, for example, HDD and/or DVDs. At least one DVD may have the configuration shown in FIG. 10. The VoIP phone 1600 may be connected to a memory 1630, which may be a RAM, ROM, low latency nonvolatile memory such as flash memory and/or other suitable electronic data storage. The VoIP phone 1600 may be configured to establish communications link with a VoIP network (not shown) via the Wi-Fi communication module 1640. Still other implementations in addition to those described above are contemplated.

In accordance with various embodiments of the disclosure, the methods described herein are intended for operation with dedicated hardware implementations including, but not limited to, semiconductors, application specific integrated circuits, programmable logic arrays, and other hardware devices constructed to implement the methods and modules described herein. Moreover, various embodiments of the disclosure described herein are intended for operation with as software programs running on a computer processor. Furthermore, alternative software implementations including, but not limited to, distributed processing or component/object distributed processing, parallel processing, virtual machine processing, any future enhancements, or any future protocol can also be used to implement the methods described herein.

It should also be noted that the software implementations of the disclosure as described herein are optionally stored on a tangible storage medium, such as: a magnetic medium such as a disk or tape; a magneto-optical or optical medium such as a disk; or a solid state medium such as a memory card or other package that houses one or more read-only (non-volatile) memories, random access memories, or other re-writable (volatile) memories. A digital file attachment to email or other self-contained information archive or set of archives is considered a distribution medium equivalent to a tangible storage medium. Accordingly, the disclosure is considered to include a tangible storage medium or distribution medium, as listed herein and including art-recognized equivalents and successor media, in which the software implementations herein are stored.

While the disclosure has been described in terms of exemplary embodiments, those skilled in the art will recognize that the disclosure can be practiced with modifications in the spirit and scope of the appended claims. These examples given above are merely illustrative and are not meant to be an exhaustive list of all possible designs, embodiments, applications or modifications of the disclosure.

We claim:

1. A timing loop for generating a channel clock signal for driving an analog to digital converter (ADC), the timing loop comprising:
   a limit equalizer configured to boost high frequency components of a digital output signal from the ADC;
   a slicer configured to generate a temporary decision signal based on the boosted digital output signal from the limit equalizer;
   a phase detector configured to generate a timing error signal based on the boosted digital output signal from the limit equalizer and the temporary decision signal from the slicer; and
   a first filter configured to generate the channel clock signal for driving the ADC based on the timing error signal from the phase detector.

2. The timing loop of claim 1, further comprises a first booster configured to boost the digital output signal.

3. The timing loop of claim 2, wherein the first booster comprises a finite impulse response (FIR) filter.

4. The timing loop of claim 2, wherein the first booster comprises:
   first, second and third branches arranged in parallel and an adder connected to the first, second and third branches,
   the first branch comprises a first multiplier configured to multiply the digital output signal from the ADC by a first value;
   the second branch comprises a first delay and a second multiplier arranged in series, the second multiplier configured to multiply an output from the first delay by a second value; and
   the third branch comprises the first delay, a second delay and a third multiplier arranged in series, the third multiplier configured to multiply an output from the second delay by a third value.

5. The timing loop of claim 2, wherein the first booster is responsive to the ADC.

6. The timing loop of claim 2, wherein the limit equalizer is responsive to the first booster.

7. The timing loop of claim 2, wherein the digital output signal from the ADC is an asymmetrically compensated digital output signal.

8. The timing loop of claim 7, further comprising:
   a slicer bias loop configured to generate an asymmetry compensation signal for the digital output signal from the ADC; and
   a first adder configured to asymmetrically compensate the digital output signal from the ADC based on the asymmetry compensation signal from the slicer bias loop.

9. The timing loop of claim 8, wherein the first adder is responsive to the first booster.

10. The timing loop of claim 8, wherein the slicer bias loop comprises:
    a bias error detector configured to generate a bias error signal based on the asymmetrically compensated digital output signal from the first adder and the temporary decision signal from the slicer; and
    a second filter configured to generate the asymmetry compensation signal based on the bias error signal from the bias error detector.

11. The timing loop of claim 1, wherein the limit equalizer comprises first and second branches arranged in parallel and a second adder connected to the first and second branches, and
    the first branch comprises a limiter and a booster arranged in series, and the second branch includes a phase rotator and a first delay arranged in series.

12. The timing loop of claim 11, wherein the phase detector comprises third and fourth branches arranged in parallel and a multiplier connected to the third and fourth branches, the fourth branch including a third filter.

13. The timing loop of claim 12, wherein the bias error detector comprises fifth and sixth branches arranged in parallel and a multiplier connected to the fifth and sixth branches, the sixth branch including a fourth filter.

14. A method of generating a timing error signal, comprising steps of:
converting an analog input signal to a digital output signal;
boosting high frequency components of the digital output signal;
deriving a temporary decision signal based on the boosted digital output signal; and
generating the timing error signal based on the boosted digital output signal and the temporary decision signal.

15. The method of claim 14, further comprising a step of compensating asymmetrical qualities of the digital output signal prior to boosting the high frequency components of the digital output signal.

16. The method of claim 14, further comprising a step of boosting the digital output signal.

17. A method of generating a timing signal, comprising:
converting an analog input signal to a digital output signal;
boosting high frequency components of the digital output signal;
deriving a temporary decision signal based on the boosted digital output signal; and
generating a timing error signal based on the boosted digital output signal and the temporary decision signal,
wherein the step of boosting the high frequency components of the digital output signal comprises steps of:
splitting the digital output signal;
providing the split digital output signal to first and second signal paths, the first signal path comprising a limiter and a booster arranged in series, and the second signal path comprising a phase rotator and a delay arranged in series; and
adding outputs from the booster and the delay.

18. The method of claim 17, wherein the step of generating the timing error signal comprises steps of:
filtering the temporary decision signal; and
adding the filtered temporary decision signal to the boosted digital output signal.

19. The method of claim 15, wherein the step of compensating the asymmetrical qualities of the digital output signal comprises steps of:
generating an asymmetric compensation signal based on the digital output signal and the temporary decision signal; and
adding the asymmetrical compensation signal and the digital output signal.

20. The method of claim 19, wherein the step of generating asymmetric compensation signal comprises steps of:
generating a bias error signal based on the digital output signal and the temporary decision signal; and
filtering the bias error signal.

21. The method of claim 20, wherein the step of generating the bias error signal comprises steps of:
filtering the digital output signal; and
multiplying the digital output signal by the temporary decision signal.

* * * * *